(12) United States Patent
Wu

(10) Patent No.: US 6,872,583 B1
(45) Date of Patent: Mar. 29, 2005

(54) TEST STRUCTURE FOR HIGH PRECISION ANALYSIS OF A SEMICONDUCTOR

(75) Inventor: David Donggang Wu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 502 days.

(21) Appl. No.: 09/503,838

(22) Filed: Feb. 15, 2000

(51) Int. Cl.[7] .............................................. H01L 21/66
(52) U.S. Cl. ............................. 438/18; 257/48; 438/14; 438/17
(58) Field of Search ........................... 257/48; 324/537, 324/765, 769; 438/14, 17, 18

(56) References Cited

U.S. PATENT DOCUMENTS

| | | | | |
|---|---|---|---|---|
| 5,466,956 A | * | 11/1995 | Aeba | 257/203 |
| 6,022,750 A | * | 2/2000 | Akram et al. | 438/18 |
| 6,077,719 A | * | 6/2000 | Koike | 438/17 |
| 6,096,567 A | * | 8/2000 | Kaplan et al. | 438/14 |

OTHER PUBLICATIONS

IBM Technical Disclosure Bulletin, NA83045736, Multi-Chip Probe Card for Capacitance Voltage Measurements, Apr. 1983.*

J. Olowolafe, C–V Profiles, Wiley Encyclopedia of Electrical and Electronics Engineering Online, (Wiley & Sons, 1999).*

* cited by examiner

*Primary Examiner*—Richard Elms
*Assistant Examiner*—C. Wilson

(57) ABSTRACT

Semiconductor chip design and analysis is enhanced by using a dummy structure for analyzing a test structure in a test chip. According to an example embodiment of the present invention, a dummy structure is formed having structure that is about identical to that of test structure in a test chip. The parasitic capacitance of the dummy structure is determined and used to analyze the test structure. In this manner, the parasitic capacitance associated with the test structure can be accounted for, enhancing the ability to design, test, and debug semiconductor chips.

16 Claims, 3 Drawing Sheets

TEST STRUCTURE FOR HIGH PRECISION ANALYSIS OF A SEMICONDUCTOR

FIELD OF THE INVENTION

The present invention relates generally to semiconductor devices and their fabrication and, more particularly, to semiconductor devices and their manufacture involving techniques for designing, analyzing, and debugging circuitry within an integrated circuit.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages.

As the scaling of semiconductor chips decreases and the density of circuitry and devices within the chip increases, testing such devices becomes increasingly important but also more difficult. One inherent attribute of semiconductor chips that makes testing difficult is the existence of capacitance structures within the chip. In a normal test chip, capacitance structures are relatively large because the parasitic capacitance contributed by pads, metal leads, and probes are in the order of picofarad (pF). The capacitance added to devices within a semiconductor chip is detrimental to the design, testing, and analysis of semiconductor chips because it can negatively affect the ability to obtain accurate measurements, such as capacitance-voltage (C-V) measurements, from devices within the chip. As technology scales, the capacitance of devices in the chip becomes more important, requiring regular monitoring of capacitance for accurate analysis of the devices.

One example useful method for testing semiconductor chips includes using probe cards. Probe cards are used to probe devices within the semiconductor chip for testing purposes, such as to determine if the devices meet design specifications. However, probe card testing makes parasitic capacitance cancellation extremely difficult on the same structure. The addition of a probe to the semiconductor device also adds to the capacitance of the device provided by the pads, metal leads, and other circuitry in the chip, making the parasitic capacitance even greater. The parasitic capacitance characteristics of semiconductor chips is a hindrance to the furthering of semiconductor device technologies.

SUMMARY OF THE INVENTION

The present invention is directed to a method and system for testing a semiconductor device involving the detection of parasitic capacitance to improve testing, designing, and debugging semiconductor chips. The present invention is exemplified in a number of implementations and applications, some of which are summarized below.

According to an example embodiment of the present invention, a semiconductor chip is analyzed. A test structure having a device, at least one pad, and at least one metal lead connecting the pad to the device is formed in the chip. A dummy structure is formed having a structure that is nearly identical to the test structure except for a gap in the metal lead to the device, wherein the gap disrupts the continuity to the structure. The dummy structure is probed and the parasitic capacitance of the dummy structure is determined. Using the determined parasitic capacitance to cancel out the parasitic capacitance of the test structure, the semiconductor chip is analyzed.

According to another example embodiment of the present invention, a system is arranged to test a semiconductor chip having a test structure and a dummy structure. The system includes a first probe adapted to measure the parasitic capacitance of the dummy structure. A second probe is adapted to couple to and analyze the test structure using the measured parasitic capacitance from the dummy structure.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
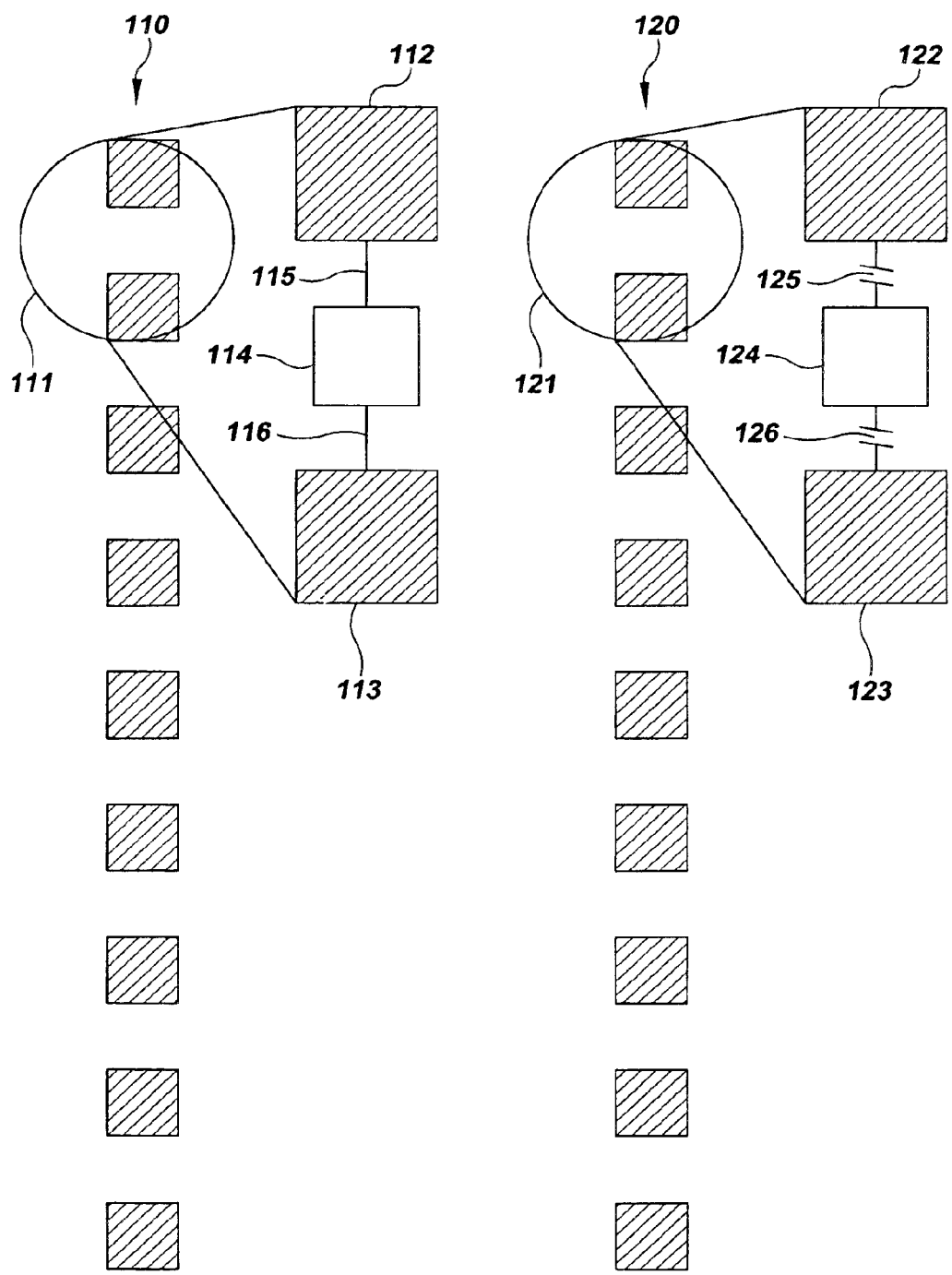
FIG. 1 is a portion of a semiconductor chip, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for testing a variety of different types of semiconductor chips, and the invention has been found to be particularly suited for testing devices requiring or benefiting from the determination of parasitic capacitance for chip analysis. While the present invention is not necessarily limited to such devices, various aspects of the invention may be appreciated through a discussion of various examples using this context.

In connection with an example embodiment of the present invention, it has been discovered that the parasitic capacitance of test structure having a device under test (DUT) in a semiconductor chip can be accounted for by forming a dummy structure having a nearly identical structure to the test structure except for a gap in the lead to the DUT that disrupts continuity in the structure. The parasitic capacitance of the dummy structure is detected and used to analyze the DUT, such as to cancel-out the parasitic capacitance when testing the DUT. By canceling out the parasitic capacitance, the resolution of measurements made of the DUT is improved.

For example, one typical device formed in a semiconductor chip is a transistor. When testing the transistor, other circuitry such as metal leads, pads, and test probes add to the detected capacitance. By using a dummy structure having a discontinuity, the parasitic capacitance added to the transistor by other circuitry can be determined. When the transistor of the test structure is subsequently tested, the parasitic capacitance can be subtracted from the result, providing improved resolution in the measurement.

FIG. 1 shows a test structure 110 and a dummy structure 120 formed in a semiconductor chip, according to an example embodiment of the present invention. A portion 111 of the test structure 110 is shown in an enlarged view and includes pads 112 and 113 coupled to a device 114 by metal leads 115 and 116. A portion 121 of the dummy structure 120 is also shown in an enlarged view and includes pads 122 and 123, metal leads 125 and 126, and a device 124. The dummy structure 120 is almost identical to the test structure 110, except that the dummy structure portion 121 has a gap in the metal leads 125 and 126. More specifically, the dummy structure 120 is located near the test structure 110 so that each structure has a parasitic capacitance that is about equal to the other, but the dummy structure has a discontinuity. For example, in one implementation, locating the test and dummy structures within about 100 microns will result in a parasitic capacitance at each structure that is about equal.

During device testing, the dummy pads 122 and 123 are contacted and the parasitic capacitance of the dummy structure 120 is measured. Since the dummy structure 110 is about identical to the test structure, the measured parasitic capacitance of the dummy structure is about equal to the parasitic capacitance of the test structure. Once the parasitic capacitance is determined, the test structure can be analyzed using the determined parasitic capacitance of the dummy structure to zero-out the parasitic capacitance of the test structure. In this manner, pads 112 and 113 are contacted and the device 114 is analyzed. The resolution of the resulting analysis of the test structure 110 is enhanced due to the cancellation of the parasitic capacitance.

Figure 2A:
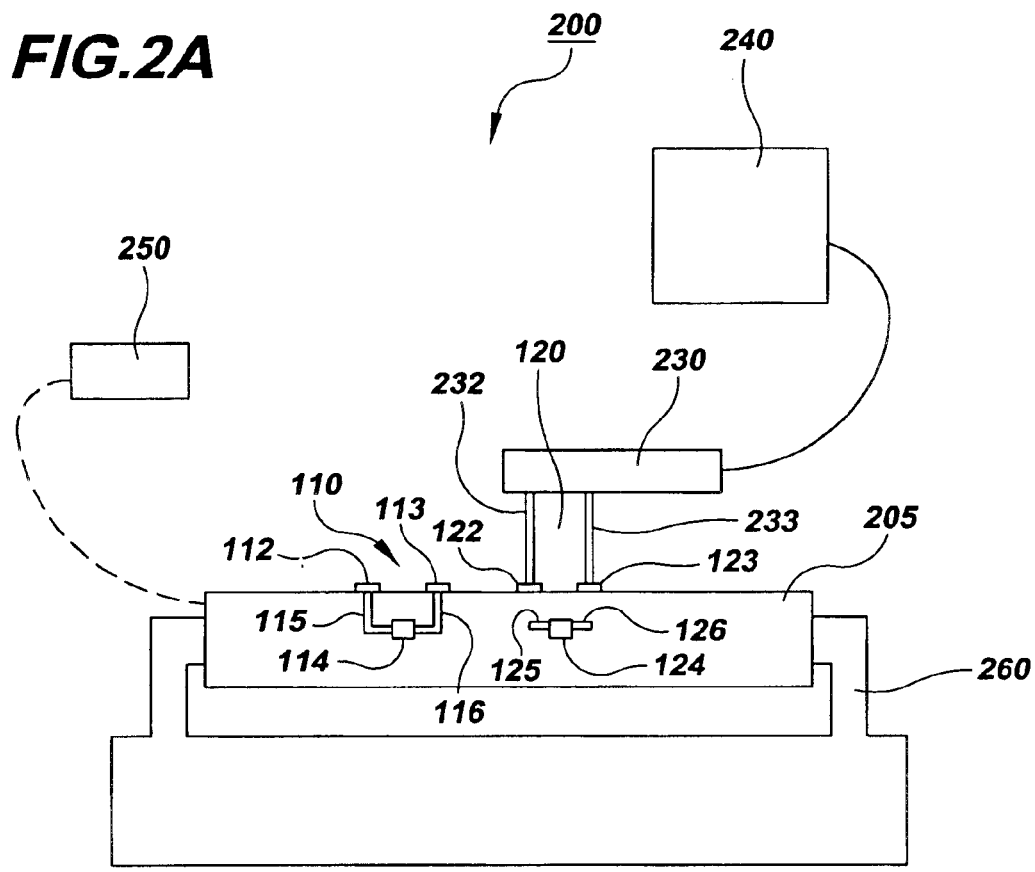
FIG. 2A is a system for analyzing a semiconductor chip, according to another example embodiment of the present invention.
Figure 2B:
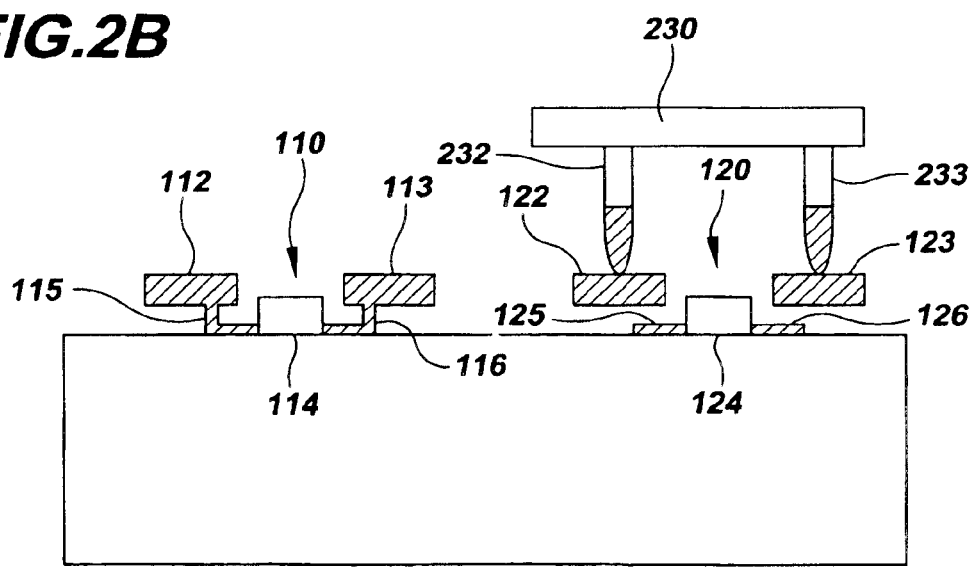
FIG. 2B is a portion of the system of FIG. 2A, according to another example embodiment of the present invention.

FIG. 2A shows a system 200 arranged for analyzing a semiconductor chip 205 having the test structure 110 and the dummy structure 120 of FIG. 1. The chip 205 is shown optionally mounted in a test fixture 260; however, other arrangements or fixtures may be used in place of the test fixture 260. A probe card 230 is coupled to the dummy structure 120 via probes 232 and 233 that are coupled to pads 122 and 123, respectively. The probe card 230 is used to measure the parasitic capacitance of the dummy structure 120, and the measured parasitic capacitance is stored at a memory device 240, such as a computer arrangement, that is coupled to the probe card 230. FIG. 2B shows an enlarged view of one example implementation of the system 200 of FIG. 2A.

In one particular implementation, the probe card is adapted to make an automated measurement. In another more particular arrangement, the test fixture 260, the probe card 230, and the memory device 240 are included in a single testing arrangement. In still another particular implementation, an energy supply 250 is also coupled to the semiconductor chip 110 and used to excite circuitry within the chip during testing.

Figure 3A:
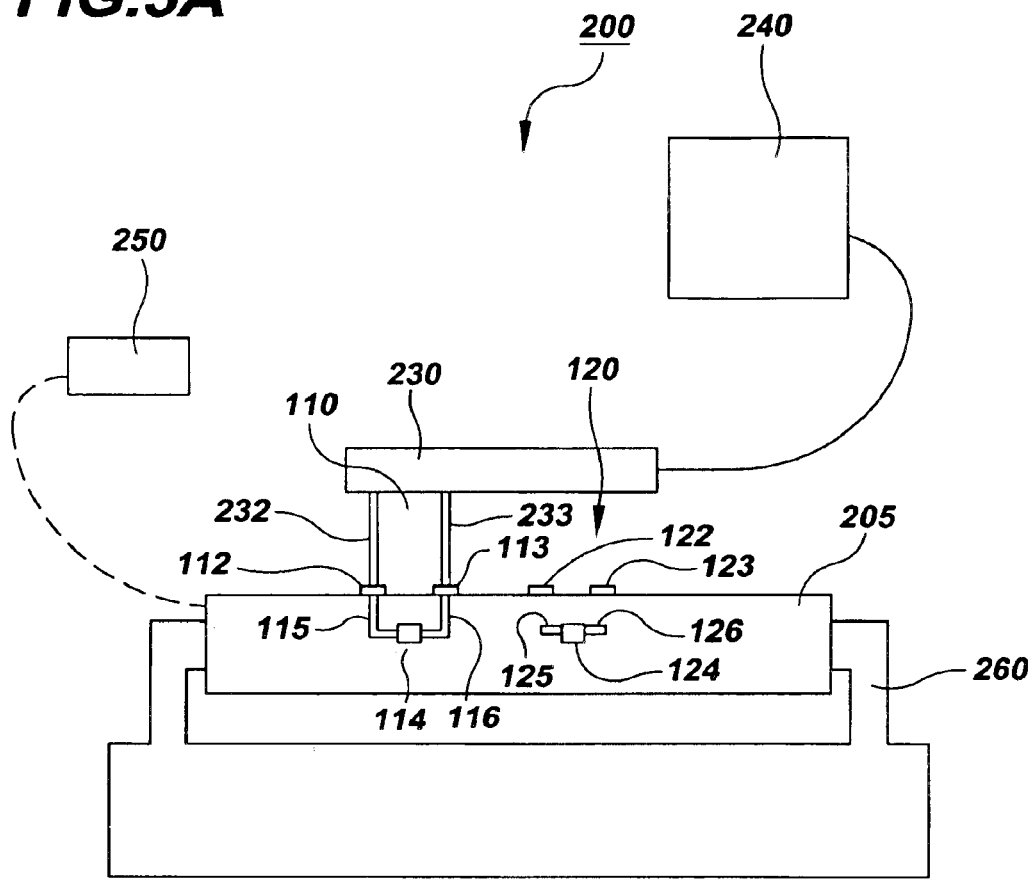
FIG. 3A is the system shown in FIG. 2A, used according to another example embodiment of the present invention.
Figure 3B:
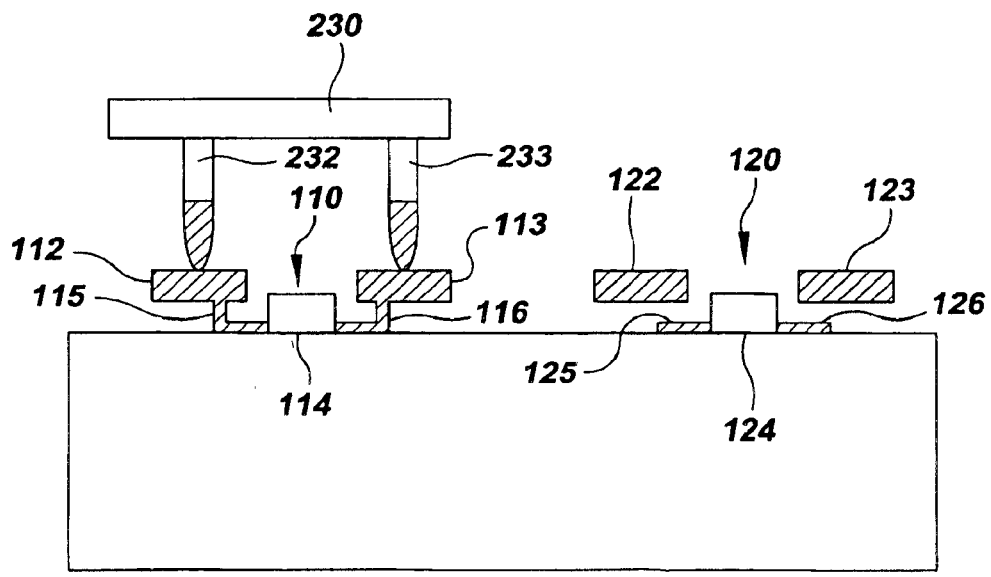
FIG. 3B is a portion of the system of FIG. 3A, according to another example embodiment of the present invention.

FIG. 3A shows the system 200 of FIG. 2A having the probe card 230 coupled to the test structure 110 via probes 232 and 233 which are coupled to test pads 112 and 113, respectively. The stored parasitic capacitance of the dummy structure 120 is used to zero-out the probe card, and the test structure is analyzed using the zeroed-out probe card. FIG. 3B shows an enlarged view of one example implementation of the system 200 of FIG. 3A. By measuring the parasitic capacitance of the dummy structure first, then coupling the probe card to the test structure, zeroing-out the probe card, and making a measurement of the test structure, the measurement can be made of the test structure independently of the parasitic capacitance contributed by the pads, metal leads, the probes, or other structure within the device.

In another example embodiment of the present invention, the parasitic capacitance of several devices is canceled out using a similar arrangement of a test structure and a dummy structure as shown in FIGS. 1, 2A, 2B, 3A and 3B. For instance, the additional test pads shown in FIG. 1 can be coupled to additional DUTs, and the dummy pads coupled to additional dummy metal leads. The probe card arrangement 230 can be used to couple to the additional structure via the same two probes. Alternatively, a probe card having a plurality of probes can be coupled to some or all of the dummy and test pads, and the measurements can be made simultaneously.

One particular application for which the present invention is applicable is for making capacitance-voltage (c-v) measurements of devices in a semiconductor chip. For example, it is often desirable to determine and monitor the capacitance of transistors within a semiconductor chip. It is also desirable to perform such monitoring in an automated setup using a probe card. The present invention provides a manner in which to make such an automated measurement of a transistor at the wafer level while achieving c-v meter resolution by canceling out the parasitic capacitance using a dummy structure.

According to another example embodiment of the present invention, a semiconductor device has a test structure and a dummy structure. The dummy structure is nearly identical to the test structure except for having a discontinuity that disables the dummy structure. Due to the nearly identical structure, the dummy structure has a capacitance that is about equal to the capacitance of the test structure. The nearly identical structure is useful, for example, for testing the device in accordance with the various example embodiments described herein.

In one implementation, the test structure in the semiconductor device includes a device, such as a transistor, at least one pad, and at least one metal lead connecting the pad and the device. The discontinuity in the dummy structure may, for example, include a break in the at least one metal lead, or the omission of the device. In a more particular implementation involving a break in at least one metal lead in the dummy structure, the test structure includes two pads, each coupled to a device via a metal lead. The dummy structure includes two pads, each having a metal lead extending from a device but having a gap in the lead between the device and the pads. In another more particular implementation, the dummy structure and the test structure are located no more than about 100 microns apart.

While the present invention has been described with reference to several particular example embodiments, those skilled in the art will recognize that many changes may be made thereto without departing from the spirit and scope of the present invention, which is set forth in the following claims.

What is claimed is:

1. A method for testing a semiconductor chip, the method comprising:

providing a test structure and a dummy structure in the semiconductor chip, wherein the dummy structure has a structure that replicates the test structure except having a discontinuity that disables the dummy structure;

coupling to the dummy structure and determining the parasitic capacitance of the dummy structure; and coupling to the test structure and analyzing the test structure using the determined parasitic capacitance of the dummy structure; and storing the determined parasitic capacitance of the dummy structure in a memory device, and wherein analyzing the test structure using the determined parasitic capacitance of the dummy structure includes accessing the stored parasitic capacitance.

2. The method of claim 1, wherein forming a test structure includes forming a device, at least one pad, and at least one metal lead connecting the pad to the device.

3. The method of claim 1, wherein determining the parasitic capacitance of the dummy structure includes probing the dummy structure.

4. The method of claim 1, wherein analyzing the test structure using the determined parasitic capacitance of the dummy structure includes probing the test structure.

5. The method of claim 1, wherein analyzing the test structure using the determined parasitic capacitance of the dummy structure includes canceling out the parasitic capacitance of the test structure.

6. The method of claim 5, wherein the dummy structure has a parasitic capacitance that is about identical to the parasitic capacitance of the test structure.

7. The method of claim 1, wherein determining the parasitic capacitance of the dummy structure includes using a probe card.

8. The method of claim 7, wherein using the probe card includes making an automated probe card measurement.

9. The method of claim 1, wherein analyzing the test structure includes using a probe card.

10. The method of claim 9, wherein using the probe card includes making an automated probe card measurement.

11. The method of claim 1, wherein analyzing the test structure includes making a c-v measurement of the test structure.

12. The method of claim 11, wherein making a c-v measurement includes making a single transistor c-v measurement at the wafer level.

13. The method of claim 1, wherein the dummy structure is formed in the semiconductor chip having the test structure.

14. The method of claim 13, wherein the dummy structure is located no more than about 100 microns from the test structure.

15. The method of claim 1, wherein determining the parasitic capacitance of the dummy structure includes determining the parasitic capacitance contributed by pads, metal leads, and probes.

16. The method of claim 1, wherein forming the test structure includes forming two pads coupled to a device via metal leads, and wherein forming the dummy structure includes forming two pads, a device, and metal leads to the device, wherein the metal leads have a discontinuity.

* * * * *